United States Patent
Snyder et al.

(10) Patent No.: US 7,215,931 B2
(45) Date of Patent: May 8, 2007

(54) METHOD AND APPARATUS FOR UP-AND-DOWN-CONVERSION OF RADIO FREQUENCY (RF) SIGNALS

(75) Inventors: Chris Snyder, Pleasantville (CA); Tajinder Manku, Kitchener (CA); Gareth Weale, New Hamburg (CA); Lawrence Wong, Markham (CA)

(73) Assignee: Sirific Wireless Corporation, Waterloo, Ontario (CA)

( * ) Notice: Subject to any disclaimer, the term of this patent is extended or adjusted under 35 U.S.C. 154(b) by 0 days.

(21) Appl. No.: 10/363,158

(22) PCT Filed: Jun. 19, 2002

(86) PCT No.: PCT/CA01/00876

§ 371 (c)(1),
(2), (4) Date: Aug. 1, 2003

(87) PCT Pub. No.: WO02/19548

PCT Pub. Date: Mar. 7, 2002

(65) Prior Publication Data

US 2004/0048585 A1  Mar. 11, 2004

(51) Int. Cl.
*H04B 1/40* (2006.01)
*H04B 1/18* (2006.01)
*H04B 1/16* (2006.01)
*H04B 1/38* (2006.01)
*H04B 1/66* (2006.01)

(52) U.S. Cl. .................. 455/76; 455/165.1; 455/183.1; 455/205; 375/223; 375/239; 375/241

(58) Field of Classification Search .................. 455/76, 455/165.1, 183.1, 260, 42, 44, 61, 102, 108, 455/205, 210, 228, 295, 86, 208, 209, 207, 455/314, 315, 317, 310, 311; 375/223, 237, 375/238, 239, 241, 242, 261, 268, 271, 298, 375/300
See application file for complete search history.

(56) References Cited

U.S. PATENT DOCUMENTS 4,110,834 A     8/1978 Altwein ...................... 364/841

(Continued)

FOREIGN PATENT DOCUMENTS

| EP | 0837565 | 4/1998 |
|----|---------|--------|
| EP | 902549  | 3/1999 |
| EP | 977351  | 2/2000 |
| GB | 2331207 | 5/1999 |
| WO | 9601006 | 1/1996 |

OTHER PUBLICATIONS

Multi Carrier Spread Spectrum Modulation with Reduced Dynamic Range by Aue et al. 1996.
International Search Report dated Oct. 10, 2002.

*Primary Examiner*—Nay Maung
*Assistant Examiner*—Andrew Wendell
(74) *Attorney, Agent, or Firm*—Shin Hung; Borden Ladner Gervais LLP

(57) ABSTRACT

This patent describes a method and system which overcomes the LO-leakage problem during modulation and demodulation, common to direct conversion and similar RF transmitters and receivers. This problem is solved using a virtual local oscillator (VLO™) signal which emulates mixing with a local oscillators (LO) signal. The VLO signal is constructed using complementary mixing signals that suppress mixing power in the bandwidth of the input signal, and within the bandwidth of the output frequency. Specifically, mixing is done in two or more stages, using time-varying mixing signals $\phi_1$ and $\phi_2$ which satisfy the following criteria: $\phi_1 * \phi_2$ having significant power at the frequency of the LO being emulated, one of $\phi_1$ and $\phi_2$ having minimal power around the frequency of the output signal y(t), and the other of $\phi_1$ and $\phi_2$ having minimal power around the center frequency, $f_{RF}$, of the input signal x(t).

42 Claims, 10 Drawing Sheets

U.S. PATENT DOCUMENTS

| | | | |
|---|---|---|---|
| 4,791,377 A * | 12/1988 | Grandfield et al. | 327/105 |
| 5,390,346 A | 2/1995 | Marz | 455/260 |
| 5,519,732 A * | 5/1996 | Chester | 375/295 |
| 5,572,264 A * | 11/1996 | Mizukami et al. | 348/735 |
| 5,796,783 A * | 8/1998 | Crawford | 375/298 |
| 5,838,717 A | 11/1998 | Ishii et al. | 375/201 |
| 6,014,408 A | 1/2000 | Naruse et al. | 375/208 |
| 6,061,551 A * | 5/2000 | Sorrells et al. | 455/118 |
| 6,798,848 B1 * | 9/2004 | Claxton et al. | 375/316 |
| 6,965,759 B2 * | 11/2005 | Aoki | 455/183.1 |
| 2001/0024943 A1 * | 9/2001 | Welland | 455/76 |
| 2002/0094794 A1 * | 7/2002 | Manku et al. | 455/189.1 |
| 2004/0131125 A1 * | 7/2004 | Sanderford et al. | 375/261 |
| 2005/0153677 A1 * | 7/2005 | Vorenkamp et al. | 455/340 |

\* cited by examiner

METHOD AND APPARATUS FOR UP-AND-DOWN-CONVERSION OF RADIO FREQUENCY (RF) SIGNALS

RELATED APPLICATIONS

This application is National Stage Application based on PCT/CA01/00876, having an International filing date of Jun. 19, 2001, which in turn claims priority to three applications: PCT/CA00/00994, filed on Sep. 1, 2000; PCT/CA00/00995, filed on Sep. 1, 2000; and PCT/CA00/00996 filed on Sep. 1, 2000, the entirety of which are incorporated herein by reference.

The present invention relates generally to communications, and more specifically, to a fully-integrable method and apparatus for up- and down-conversion of radio frequency (RF) and baseband signals with improved performance.

BACKGROUND OF THE INVENTION

Many communication systems modulate electromagnetic signals from baseband to higher frequencies for transmission, and subsequently demodulate those high frequencies back to their original frequency band when they reach the receiver. The original (or baseband) signal, may be, for example: data, voice or video. These baseband signals may be produced by transducers such as microphones or video cameras, be computer generated, or transferred from an electronic storage device. In general, the high frequencies provide longer range and higher capacity channels than baseband signals, and because high frequency RF signals can propagate through the air, they can be used for wireless transmissions as well as hard wired or fibre channels.

All of these signals are generally referred to as radio frequency (RF) signals, which are electromagnetic signals; that is, waveforms with electrical and magnetic properties within the electromagnetic spectrum normally associated with radio wave propagation. The electromagnetic spectrum was traditionally divided into 26 alphabetically designated bands, however, the International Telecommunication Union (ITU) formally recognizes 12 bands, from 30 Hz to 3000 GHz. New bands, from 3 THz to 3000 THz, are under active consideration for recognition.

Wired communication systems which employ such modulation and demodulation techniques include computer communication systems such as local area networks (LANs), point to point signalling, and wide area networks (WANs) such as the Internet. These networks generally communication data signals over electrically conductive or optical fibre channels. Wireless communication systems which may employ modulation and demodulation include those for public broadcasting such as AM and FM radio, and UHF and VHF television. Private communication systems may include cellular telephone networks, personal paging devices, HF (high frequency) radio systems used by taxi services, microwave backbone networks, interconnected appliances under the Bluetooth standard, and satellite communications. Other wired and wireless systems which use RF modulation and demodulation would be known to those skilled in the art.

One of the current problems in the art, is to develop modulation and demodulation techniques and devices with the following characteristics:
 physically small;
 low power consumption;
 inexpensive; and
 have good performance characteristics.

For cellular telephones, for example, it is desirable to have transmitters and receivers (which may be referred to in combination as a transceiver) which can be fully integrated onto inexpensive, low power, integrated circuits (ICs), Several attempts at completely integrated transceiver designs have met with limited success. For example, most RF topology typically requires at least two high quality filters that cannot be economically integrated within any modem IC technology. Other RF receiver topologies exist, such as image rejection architectures, which can be completely integrated on a chip, but lack in overall performance. Most receivers use the "super-heterodyne", topology, which provides excellent performance, but does not meet the desired level of integration for modern wireless systems.

Existing transceiver solutions and their associated problems and limitations are summarized below.

1. Super-heterodyne:

The super-heterodyne receiver uses a two-step frequency translation method to convert an RF signal to a baseband signal. FIG. 1 presents a block diagram of a typical super-heterodyne receiver 10. Generally, the mixers labelled M1 12, MI 14, and MQ 16 are used to translate an incoming RF signal to baseband or to some other frequency. The balance of the components amplify the signal being processed and filter noise from it.

More specifically, the RF band pass filter (BPF1) 18 first filters the incoming signal and corruptive noise coming from the antenna 20, attenuating out of band signals and passing the desired signal (note that this band pass filter 18 may also be a duplexer. A duplexer is an electronic switch which permits a receiver and transmitter to use the same antenna by alternately interconnecting them with the antenna). A low noise amplifier (LNA) 22 then amplifies the filtered antenna signal, increasing the strength of the RF signal and reducing the noise figure of the receiver 10. The signal is next filtered by another band pass filter (BPF2) 24 usually identified as an image rejection filter. The desired signal, plus residual unwanted signals, then enter mixer M1 12 which multiplies this signal with a periodic sinusoidal signal generated by the local oscillator (LO1) 26. The mixer M1 12 receives the signal from the image rejection filter 24 and causes both a down-conversion and an up-conversion in the frequency domain. Usually, the down-converted portion is retained at the so-called "Intermediate Frequency" (IF).

Generally, a mixer is a circuit or device that accepts as its input two different frequencies and presents at its output:
(a) a signal equal in frequency to the sum of the frequencies of the input signals;
(b) a signal equal in frequency to the difference between the frequencies of the input signals; and
(c) the original input frequencies.

Note that the frequency conversion process causes a second band of frequencies to be superimposed upon the desired signal at the IF frequency. These "image frequencies" cannot be blocked by a band pass filter 24 so they corrupt the desired signal. Note also that the typical embodiment of a mixer is a digital switch, which may generate significantly more tones than those described in (a) through (c).

The IF signal is next filtered by a band pass filter (BPF3) 28 typically called the channel filter, which is centred around the IF frequency, thus filtering out mixer signals (a) and (c) above.

The signal is then amplified by an amplifier (IFA) 30, and is split into its in-phase (I) and quadrature (Q) components, using mixers MI 14 and MQ 16 and orthogonal mixing signals generated by local oscillator (LO2) 32 and 90 degree phase shifter 34. LO2 32 generates a regular, periodic signal which is typically tuned to the IF frequency, so that the signals coming from the outputs of MI 14 and MQ 16 are now at baseband, that is, the frequency at which they were originally generated. The two signals are next filtered using low pass filters LPFI 36 and LPFQ 38 to remove the unwanted products of the mixing process, producing baseband I and Q signals. The signals may then be amplified by gain-controlled amplifiers AGCI 40 and AGCQ 42, and digitized via analog to digital converters ADI 44 and ADQ 46 if required by the receiver.

The main problems with the super-heterodyne design are:
it requires expensive off-chip components, particularly band pass filters 18, 24, 28, and low pass filters 36, 38 to remove unwanted signal components;
the off-chip components require design trade-offs that increase power consumption and reduce system gain;
image rejection is limited by the off-chip components, not by the target integration technology;
isolation from digital noise can be a problem; and
it is not fully integratable.

2. Image Rejection Architectures:

Several image rejection architectures exist, but are not widely used. The two most well known being the Hartley Image Rejection Architecture and the Weaver Image Rejection Architecture. There are other designs, which are generally based on these two architectures, and other methods which employ poly-phase filters to cancel image components. Generally, either accurate signal phase shifts or accurate generation of quadrature local oscillators are employed in these architectures to cancel the image frequencies. The amount of image cancellation is directly dependent upon the degree of accuracy in producing the phase shift or in producing the quadrature local oscillator signals.

Although the integratability of these architectures is high, their performance is relatively poor due to the required accuracy of the phase shifts and quadrature oscillators. This architecture has been used for dual mode receivers on a single chip.

3. Direct Conversion:

Direct conversion architectures demodulate RF signals to baseband in a single step, by mixing the RF signal with a local oscillator signal at the carrier frequency of the RF signal. There is therefore no image frequency, and no image components to corrupt the signal. Direct conversion receivers offer a high level of integratability, but also have several important problems. Hence, direct conversion receivers have thus far proved useful only for signalling formats that do not place appreciable signal energy near DC after conversion to baseband.

A typical direct conversion receiver 60 is shown in FIG. 2. The RF band pass filter (BPF1) 18 first filters the signal coming from the antenna 20 (this band pass filter 18 may also be a duplexer). A low noise amplifier 22 is then used to amplify the filtered antenna signal, increasing the strength of the RF signal and reducing the noise figure of the receiver 60.

The signal is then split into its quadrature components and demodulated in a single stage using mixers MI 14 and MQ 16, and orthogonal signals generated by local oscillator (LO) 32 and 90 degree phase shifter 34. LO 32 generates a regular, periodic signal which is tuned to the incoming wanted frequency rather than an IF frequency as in the case of the super-heterodyne receiver 10. The signals coming from the outputs of MI 14 and MQ 16 are now at baseband, that is, the frequency at which they were originally generated. The two signals are next filtered using low pass filters LPFI 36 and LPFQ 38, are amplified by gain-controlled amplifiers AGCI 40 and AGCQ 42, and are digitized via analog to digital converters ADI 44 and ADQ 46.

Direct conversion RF receivers 60 have several advantages over super-heterodyne systems 10 in term of cost, power consumption, and level of integration, however, there are also several serious problems with direct conversion. These problems include:

noise near baseband (that is, 1/f noise) which corrupts the desired signal. The term "1/f noise" is used to describe a number of types of noise that are greater in magnitude at lower frequencies than at higher frequencies (typically, their magnitude increases roughly with the inverse of the signal frequency);

local oscillator (LO) leakage in the RF path that creates DC offsets. As the LO frequency is the same as the incoming signal being demodulated, any leakage of the LO signal onto the antenna 20 side of the receiver 10 will pass through to the output side as well;

local oscillator (LO) leakage into the RF path that causes desensitization. Desensitation is the reduction of desired signal gain as a result of receiver reaction to an undesired signal. The gain reduction is generally due to overload of some portion of the receiver, such as the AGC circuitry 40, 42 resulting in suppression of the desired signal because the receiver will no longer respond linearly to incremental changes in input voltage.

noise inherent to mixed-signal integrated circuits corrupts the desired signal;

large on-chip capacitors are required to remove unwanted noise and signal energy near DC, which makes integrability expensive. These capacitors are typically placed between the mixers 14, 16 and the low pass filters 36, 38; and errors are generated in the quadrature signals due to inaccuracies in the 90 degree phase shifter.

4. Near Zero-IF Conversion:

This receiver architecture is similar to the direct conversion architecture, in that the RF input signal band is translated close to baseband in a single step using a regular, periodic oscillator signal. However, the desired signal is not brought exactly to baseband and therefore DC offsets and 1/f noise do not contaminate the output signal. Image frequencies are again a problem though, as in the case of the super-heterodyne structure.

Additional problems encountered with near zero-IF architectures include:
the need for very accurate quadrature local oscillators;
the need for several balanced signal paths for purposes of image cancellation;
noise inherent to mixed-signal integrated circuits which corrupts the desired output signal; and
isolation from digital noise can be a problem.

5. Sub-sampling Down-Conversion:

This method of signal down-conversion utilizes subsampling of the input signal to effect the frequency translation, that is, the input signal is sampled at a lower rate than the signal frequency. This may be done, for example, by use of a sample and hold circuit.

Although the level of integration possible with this technique is the highest among those discussed thus far, the subsampling down-conversion method suffers from two major drawbacks:

subsampling of the RF signal causes aliasing of unwanted noise power to DC. Sampling by a factor of m increases the down-converted noise power of the sampling circuit by a factor of 2m; and subsampling also increases the effect of noise in the sampling clock. In fact, the clock phase noise power is increased by $m^2$ for sampling by a factor of m.

There is therefore a need for a method and apparatus of modulating and demodulating RF signals which allows the desired integrability along with good performance.

SUMMARY OF THE INVENTION

It is therefore an object of the invention to provide a novel method and system of modulation and demodulation which obviates or mitigates at least one of the disadvantages of the prior art.

One aspect of the invention is broadly defined as a synthesizer for generating signals to be input to successive mixers for modulating or demodulating an input signal x(t) to an output y(t), said synthesizer comprising: a first signal generator for producing a first time-varying signal $\phi_1$; and a second signal generator for producing a second time-varying signal $\phi_2$; where $\phi_1 * \phi_2$ has significant power at the frequency of a local oscillator signal being emulated, and one of said $\phi_1$ and $\phi_2$ has minimal power around the frequency of said output y(t), while the other of said $\phi_1$ and $\phi_2$ has minimal power around the centre frequency, $f_{RF}$, of said input signal x(t).

Another aspect of the invention is defined as a modulator or demodulator comprising: multiple mixing streams; each said mixing stream having: two mixers; a first signal generator for producing a first time-varying signal $\phi_1$; and a second signal generator for producing a second time-varying signal $\phi_2$; where $\phi_1 * \phi_2$ has significant power at the frequency of a local oscillator signal being emulated, and one of said $\phi_1$ and $\phi_2$ has minimal power around the frequency of said output y(t), while the other of said $\phi_1$ and $\phi_2$ has minimal power around the centre frequency, $f_{RF}$, of said input signal x(t); and a weighted summer for receiving the output of each said mixing stream and combining a weighted factor of each of said outputs.

An additional aspect of the invention is defined as a method of modulating or demodulating an input signal x(t) to an output y(t), comprising the steps of: generating a first time-varying signal $\phi_1$; generating a second time-varying signal $\phi_2$; where $\phi_1 * \phi_2$ has significant power at the frequency of a local oscillator signal being emulated, and one of said $\phi_1$ and $\phi_2$ has minimal power around the frequency of said output y(t), while the other of said $\phi_1$ and $\phi_2$ has minimal power around the centre frequency, $f_{RF}$, of said input signal x(t); mixing said input signal x(t) with said first time-varying signal $\phi_1$ to generate a x(t)*$\phi_1$ signal; and mixing said x(t)*$\phi_1$ signal with said second time-varying signal $\phi_2$ to generate said output y(t).

BRIEF DESCRIPTION OF THE DRAWINGS

These and other features of the invention will become more apparent from the following description in which reference is made to the appended drawings in which.

DETAILED DESCRIPTION OF THE INVENTION

The present invention relates to the frequency translation of RF signals to and from baseband in highly integrated receivers and transmitters. It is particularly concerned with the generation of signals used in the translation process which have properties that solve the image-rejection problems associated with heterodyne receivers and transmitters, and the LO-leakage and 1/f noise problems associated with direct conversion receivers and transmitters.

Figure 1:
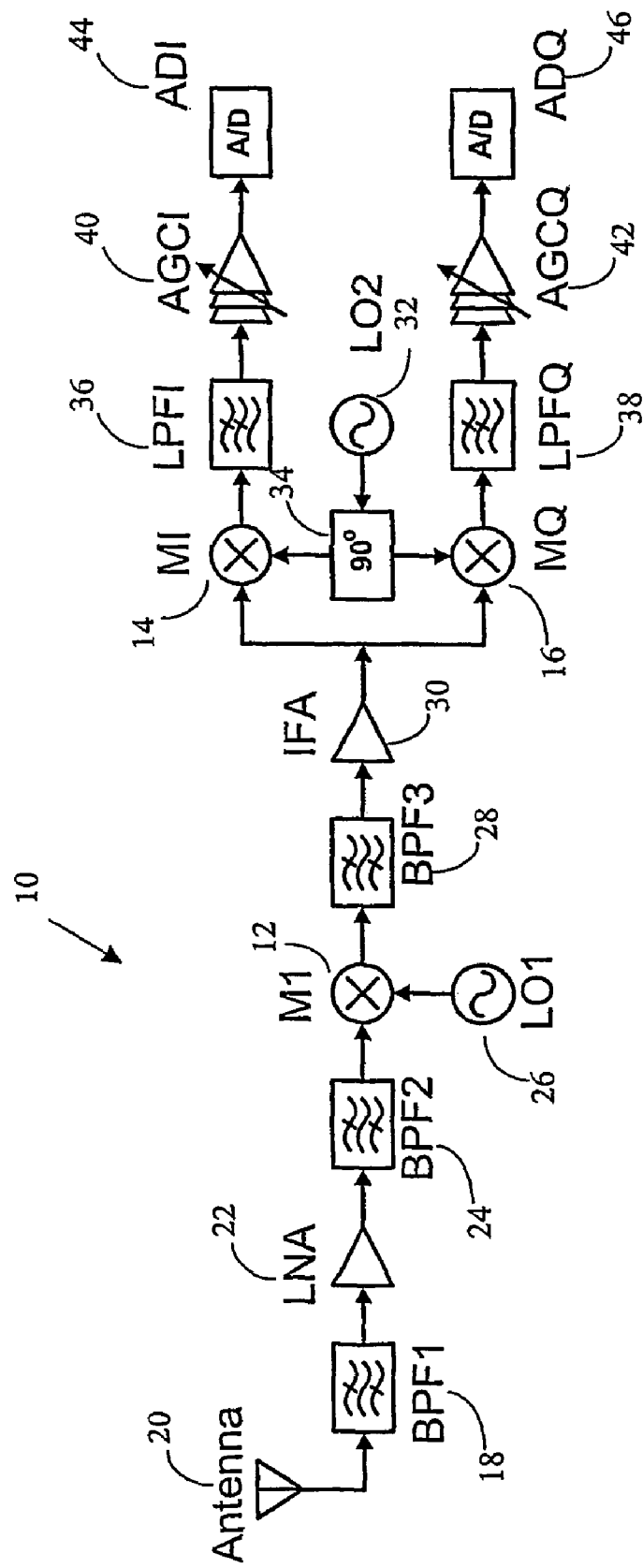
FIG. 1 presents a block diagram of a super-heterodyne system as known in the art.
Figure 2:
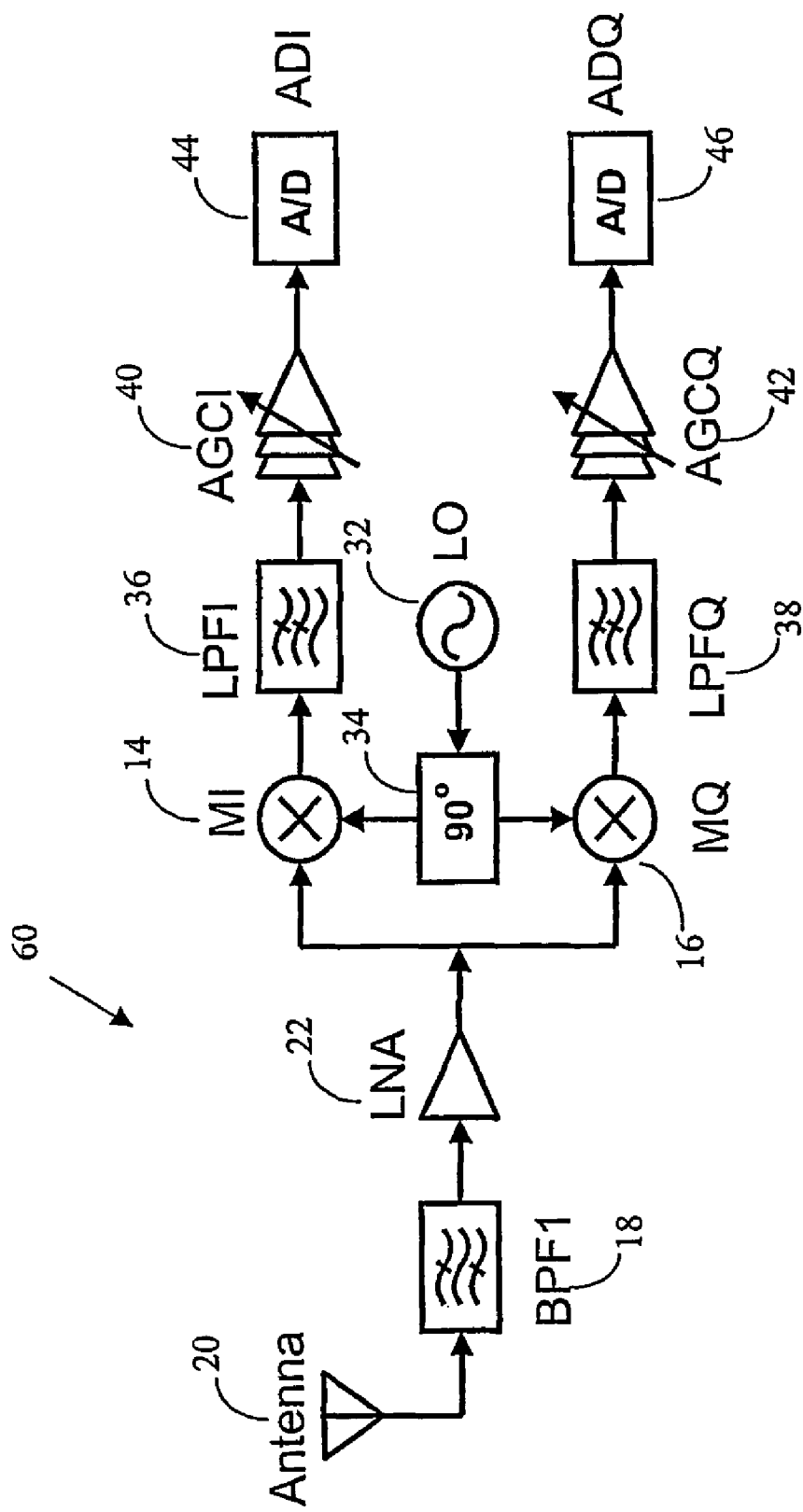
FIG. 2 presents a block diagram of a direct conversion receiver as known in the art.
Figure 3:
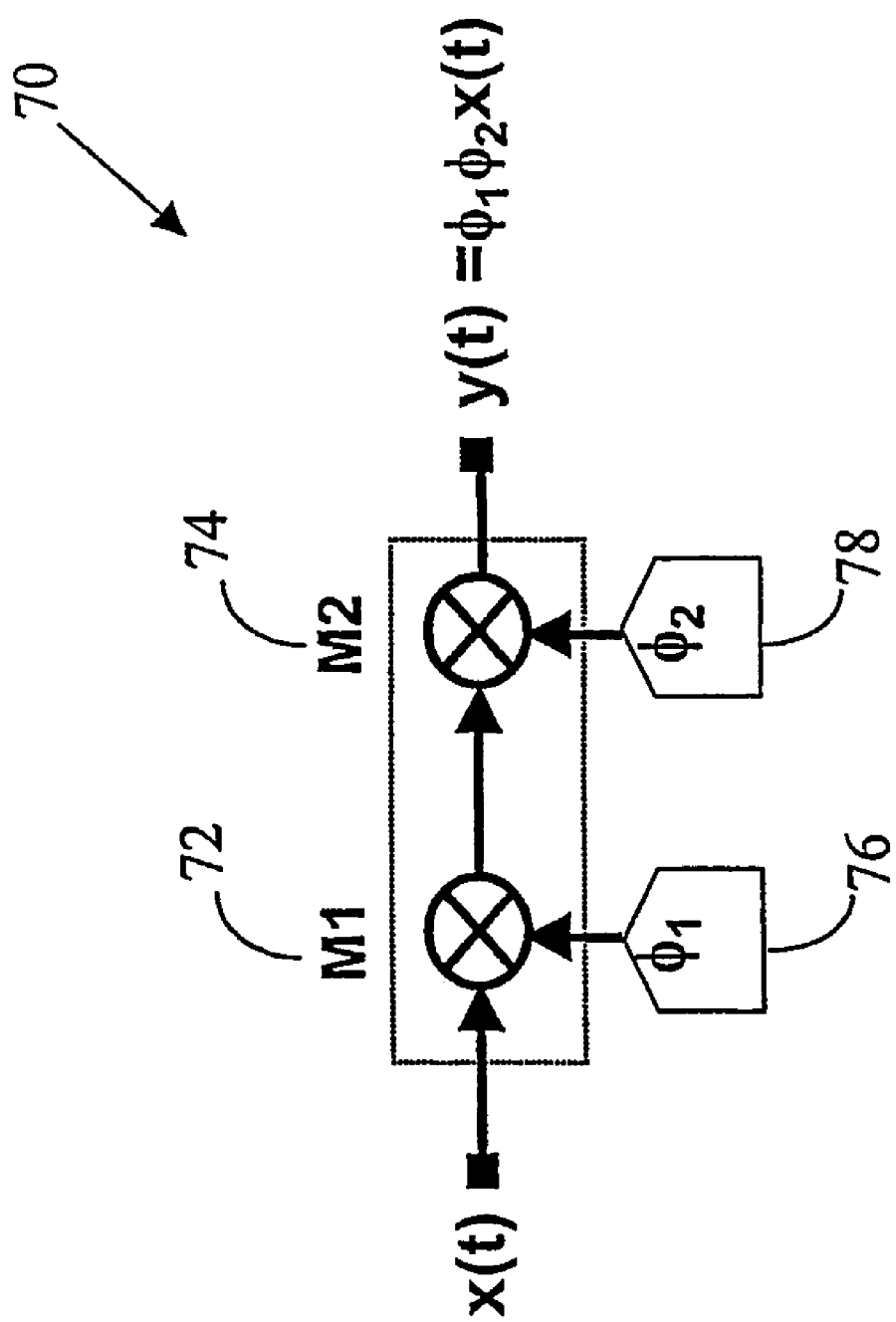
FIG. 3 presents a mixer and synthesizer arrangement in a broad embodiment of the invention.

A circuit which addresses the objects outlined above, is presented as a block diagram in FIG. 3. This figure presents a modulator or demodulator topography 70 in which an input signal x(t) is mixed with two synthesized signals (labelled $\phi_1$ and $\phi_2$) which are irregular and vary in the time domain, to effect the desired modulation or demodulation. The two mixers M1 72 and M2 74 are standard mixers known in the art, having the typical properties of an associated noise figure, linearity response, and conversion gain. The selection and design of these mixers would follow the standards known in the art, and could be, for example, double balanced mixers. Though this figure implies that various elements are implemented in analogue form, they can also be implemented in digital form.

The two synthesizers 76 and 78 generate two digitally-definable, time-varying functions $\phi_1$ and $\phi_2$ that together comprise a virtual local oscillator (VLO) signal. These two functions have the properties that:

1. their product emulates a local oscillator (LO) signal that has significant power at the frequency necessary to translate the input signal x(t) to the desired output frequency. For example, to translate the input signal x(t) to baseband, $\phi_1(t)*\phi_2(t)$ must have a frequency component at the carrier frequency of x(t); and
2. one of either $\phi_1$ and $\phi_2$, has minimal power around the frequency of the mixer pair output y(t), and the other has minimal power around the centre frequency, $f_{RF}$, of the input signal x(t). "Minimal power" means that the power should be low enough that it does not seriously degrade the performance of the RF chain in the context of the particular application. For example, if the mixer pair is demodulating the input signal x(t) to baseband, it is preferable that one of either $\phi_1$ and $\phi_2$ has minimal power around DC.

As a result, the desired modulation or demodulation is affected, but there is no LO signal to leak into the signal path and appear at the output.

As noted above, mixing two signals generates an output with:
(a) a signal equal in frequency to the sum of the frequencies of the input signals;
(b) a signal equal in frequency to the difference between the frequencies of the input signals; and
(c) the original input frequencies.

Thus, direct conversion receivers 60 known in the art must mix the input signal x(t) with a LO signal at the carrier frequency of the input signal x(t). If the LO signal of a direct conversion receiver 60 leaks into the signal path, it will also be demodulated to baseband along with the input signal x(t), causing interference. The invention does not use an LO signal, so leakage does not generate a signal at the baseband output y(t).

Any $f_{RF}$ component or component at the frequency of the output y(t) in either of the mixing signals $\phi_1$ and $\phi_2$, is suppressed or eliminated by the other mixing signal. For example, if the mixing signal $\phi_2$ has some amount of power within the bandwidth of the up-converted RF (output) signal, and it leaks into the signal path, then if will be suppressed by the $\phi_1$ mixing signal which has minimal power within the bandwidth of the up-converted RF (output) signal. This complementary mixing suppresses interference from the mixing signals $\phi_1$ and $\phi_2$.

The representation in FIG. 3 is exemplary, as any two-stage or multiple stage mixing architecture may be used to implement the invention. As well, the synthesizer for generating the time-varying mixer signals $\phi_1$ and $\phi_2$ may be comprised of a single device, or multiple devices.

As noted above, current receiver and transmitter technologies have several problems. Direct-conversion transceivers, for example, suffer from LO leakage and 1/f noise problems which limit their capabilities, while heterodyne transceivers require image-rejection techniques which are difficult to implement on-chip with high levels of performance.

The problems of image-rejection, LO leakage and 1/f noise in highly integrated transceivers can be overcome by using the complementary signals of the invention. These signals are complementary in that one of the $\phi_1$ and $\phi_2$ signals has minimal power around the frequency of the output signal y(t) (which is around DC if conversion is to baseband), and the other has minimal power around the centre frequency, $f_{RF}$, of the input signal x(t).

These signals $\phi_1$ and $\phi_2$ can, in general, be:
1. random or pseudo-random, periodic functions of time;
2. analogue or digital waveforms;
3. constructed using conventional or non-conventional bipolar waves;
4. amplitude modulated; and
5. generated in a number of manners including:
   a. being stored in memory and clocked out;
   b. being generated using digital blocks;
   c. being generated using noise shaping elements (e.g. delta-sigma elements); or
   d. being constructed using PN sequences with additional bits inserted so they comply to the above conditions.

It would be clear to one skilled in the art that virtual LO signals may be generated which provide the benefits of the invention to greater or lesser degrees. While it is possible in certain circumstances to have almost no LO leakage, it may be acceptable in other circumstances to incorporate virtual LO signals which still allow a degree of LO leakage.

Figure 4:
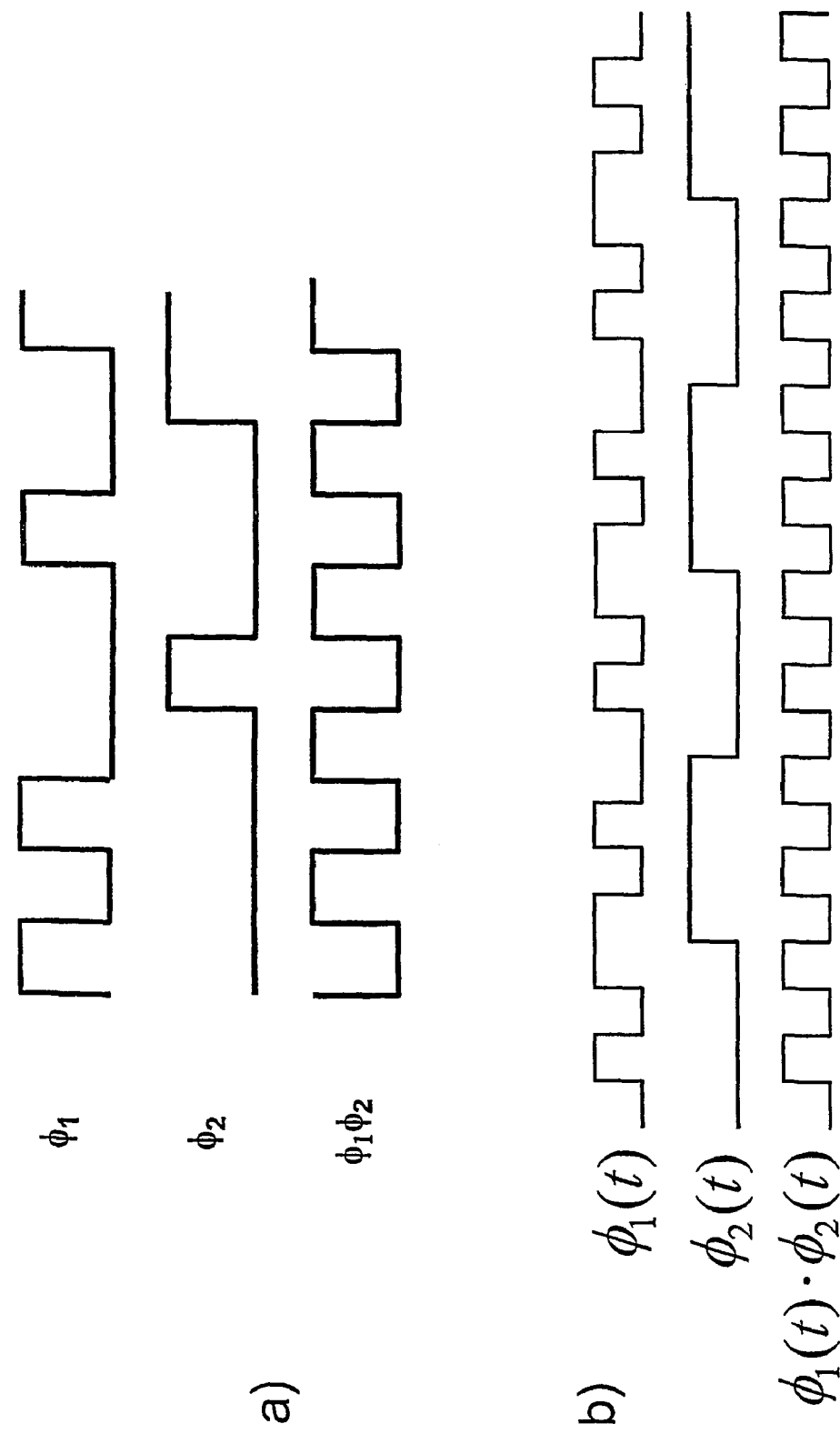
FIG. 4(a) presents a first exemplary mixer input signals pairing, plotted in amplitude against time, in an embodiment of the invention.
FIG. 4(b) presents a second exemplary mixer input signals pairing, plotted in amplitude against time, in an embodiment of the invention.

Exemplary sets of acceptable waveforms are presented in FIGS. 4(*a*) and 4(*b*), plotted in amplitude versus time. Mixing signals are typically presented herein in terms of binary 1s and 0s, however, bipolar waveforms, ±1, may also be used. Bipolar waveforms are typically used in spread spectrum applications because they use commutating mixers which periodically invert their inputs in step with a local control signal (this inverting process is distinct from mixing a signal with a local oscillator directly).

In FIG. 4(*a*), five cycles of the VLO signal are presented, labelled $\phi_1 * \phi_2$. It is important to note that at no point in the operation of the circuit is an actual "$\phi_1$, $\phi_2$" signal ever generated; the mixers M1, M2 receive separate $\phi_1$ and $\phi_2$ signals, and mix them with the input signal x(t) using different physical components. Hence, there is no LO signal which may leak into the circuit. The states of these $\phi_1$ and $\phi_2$ signals with respect to the hypothetical $\phi_1 * \phi_2$ output are as follows:

| $\phi_1 * \phi_2$ | $\phi_1$ | $\phi_2$ |
|---|---|---|
| Cycle 1-LO | HI | LO |
| Cycle 1-HI | LO | LO |
| Cycle 2-LO | HI | LO |
| Cycle 2-HI | LO | LO |
| Cycle 3-LO | LO | HI |
| Cycle 3-HI | LO | LO |
| Cycle 4-LO | HI | LO |
| Cycle 4-HI | LO | LO |
| Cycle 5-LO | LO | HI |
| Cycle 5-HI | HI | HI |

Clearly, the two mixing signals $\phi_1$ and $\phi_2$ in FIG. 4(*a*) satisfy the above criteria. Any frequency component one mixing signal might have around DC or around the centre frequency, $f_{RF}$, of the input signal x(t), is suppressed by the other. As well, the product of the two mixing signals is that of the desired LO frequency, so the input signal x(t) will be demodulated or modulated as desired.

Similarly, FIG. 4(*b*) presents a second exemplary set of acceptable waveforms, plotted in amplitude versus time. In this case, however, the waveforms repeat on a four cycle pattern. The states of these $\phi_1$ and $\phi_2$ signals with respect to the hypothetical $\phi_1 * \phi_2$ output are as follows:

| $\phi_1 * \phi_2$ | $\phi_1$ | $\phi_2$ |
|---|---|---|
| Cycle 1-LO | LO | LO |
| Cycle 1-HI | HI | LO |
| Cycle 2-LO | LO | LO |
| Cycle 2-HI | HI | LO |
| Cycle 3-LO | HI | HI |
| Cycle 3-HI | LO | HI |
| Cycle 4-LO | HI | HI |
| Cycle 4-HI | LO | HI |

While these signals may be described as "aperiodic", groups of cycles may be repeated successively. For example, the pattern of the $\phi_1$ and $\phi_2$ input signals presented in FIG. 4(*a*) which generate the $\phi_1 * \phi_2$ signal, could be allowed to repeat with every five cycles, as shown. Similarly, the pattern of the $\phi_1$ and $\phi_2$ input signals presented in FIG. 4(*b*) repeat with every four cycles. Longer cycles could certainly be used.

It would be clear to one skilled in the art that many additional pairings of signals may also be generated. The more thoroughly the criteria for selection of the $\phi_1$ and $\phi_2$ signals are complied with, the more effective the invention will be in overcoming the problems in the art.

Figure 9:
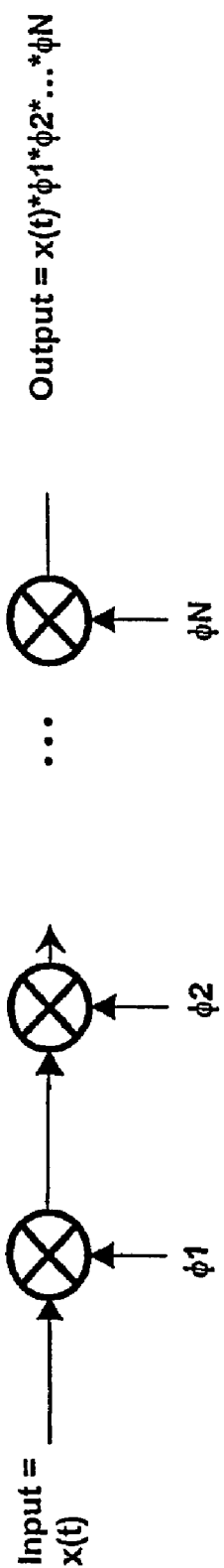
FIG. 9 presents a block diagram of an embodiment of the invention employing N mixers and N time-domain signals.

As well, rather than employing two mixing signals shown above, sets of three or more may be used (additional description of this is given hereinafter with respect to FIG. 9). A further embodiment is presented in which a plurality of mixer streams are employed, each with a weighting. This allows a universal application of the invention (see FIG. 10).

The topology of the invention is similar to that of two stage or multistage modulators and demodulators, but the use of irregular, time-varying mixer signal provides fundamental advantages over known transmitters and receivers. For example:

1. minimal 1/f noise;
2. minimal imaging problems;
3. minimal leakage of a local oscillator (LO) signal into the RF output band;
4. removes the necessity of having a second LO as required by super-heterodyne circuits, and various (often external) filters; and
5. has a higher level of integration as the components it does require are easily placed on an integrated circuit. For example, no large capacitors or sophisticated filters are required.

A high level of integration results in decreased IC (integrated circuit) pin counts, decreased signal power loss, decreased IC power requirements, imrproved SNR (signal to noise ratio), improved NF (noise factor), and decreased manufacturing costs and complexity.

The invention provides the basis for fully integrated communications transmitters and receivers. Increasing levels of integration have been the driving impetus towards lower cost, higher volume, higher reliability and lower power consumer electronics since the inception of the integrated circuit. This invention will enable communications devices to follow the same integration route that other consumer electronic products have benefited from.

Specifically, advantages from the perspective of the manufacturer when incorporating the invention into a product include:

1. significant cost savings due to the decreased parts count of an integral device. Decreasing the parts count reduces the cost of inventory control, reduces the costs associated with warehousing components, and reduces the amount of manpower to deal with higher part counts;
2. significant cost savings due to the decreased manufacturing complexity. Reducing the complexity reduces time to market, cost of equipment to manufacture the product, cost of testing and correcting defects, and reduces time delays due to errors and problems on the assembly line;
3. reduces design costs due to the simplified architecture. The simplified architecture will shorten the first-pass design time and total design cycle time as a simplified design will reduce the number of design iterations required;
4. significant space savings and increased manufacturability due to the high integrability and resulting reduction in product form factor (physical size). This implies huge savings throughout the manufacturing process as smaller device footprints enable manufacturing of products with less material such as printed circuit substrate, smaller product casing, and smaller final product packaging;
5. simplification and integrability of the invention will yield products with higher reliability, greater yield, less complexity, higher life span and greater robustness; and
6. due to the aforementioned cost savings, the invention will enable the creation of products that would otherwise be economically unfeasible.

Hence, the invention provides the manufacturer with a significant competitive advantage.

From the perspective of the consumer, the marketable advantages of the invention include:

1. lower cost products, due to the lower cost of manufacturing;
2. higher reliability as higher integration levels and lower parts counts imply products will be less prone to damage from shock, vibration and mechanical stress;
3. higher integration levels and lower parts counts imply longer product life span;
4. lower power requirements and therefore lower operating costs;
5. higher integration levels and lower parts counts imply lighter weight and physically smaller products; and
6. the creation of economical new products.

The invention can be applied in many ways which would be clear to one skilled in the art. A number of manners of creating VLO signals and applying them are described hereinafter, but it is understood that these embodiments are exemplary and not limiting.

Since the mixers in most transceivers act as solid state switches being turning on and off, it is preferable to drive the mixers using square waveforms rather than sinusoids. Square waveforms with steep leading and trailing edges will switch the state of the mixers more quickly, and at a more precise moment in time than sinusoidal waveforms.

Figure 5:
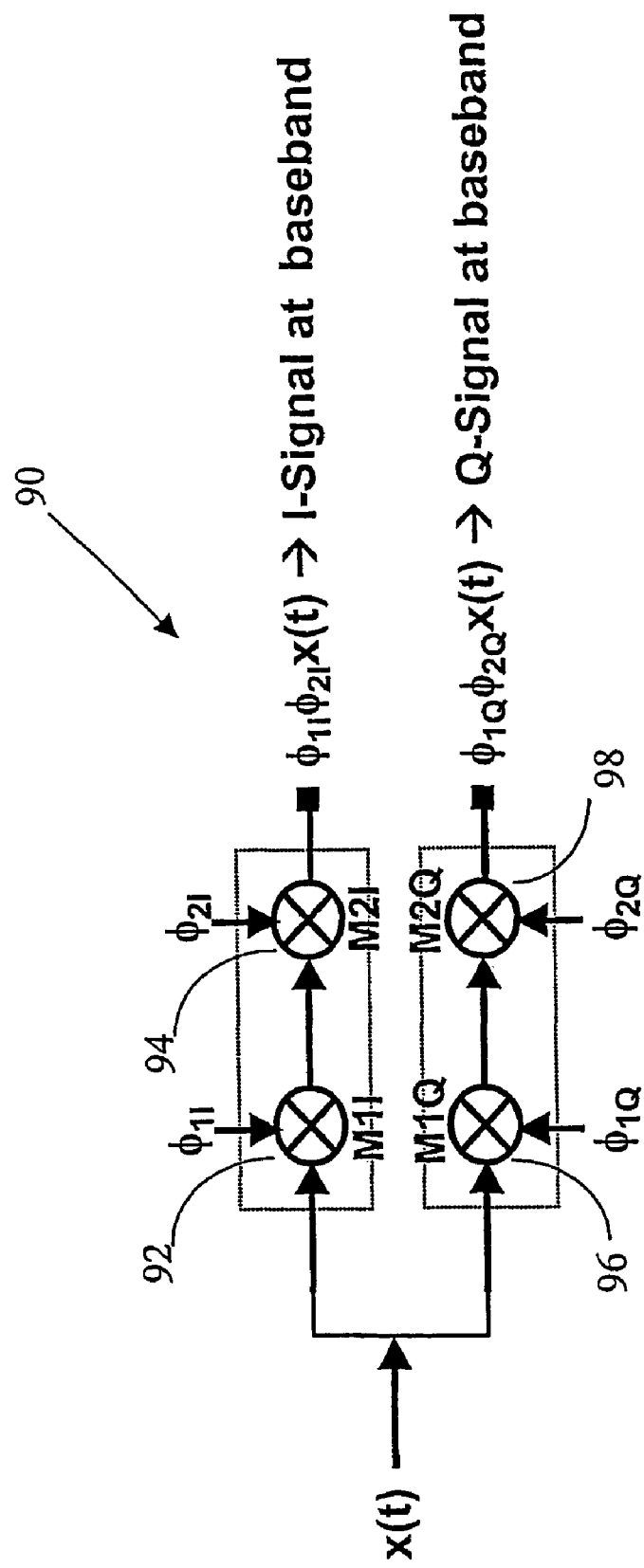
FIG. 5 presents a mixer and synthesizer arrangement for modulation or demodulation of in-phase and quadrature components of an input signal in an embodiment of the invention.

It is also important to note that in many modulation schemes, it is necessary to modulate or demodulate both in-phase (I) and quadrature (Q) components of the input signal, which requires a modulator or demodulator 90 as presented in the block diagram of FIG. 5. In this case, four modulation functions would have to be generated: $\phi_{1I}$ which is 90 degrees out of phase with $\phi_{1Q}$; and $\phi_{2I}$ which is 90 degrees out of phase with $\phi_{2Q}$. The pairing of signals $\phi_{1I}$ and $\phi_{2I}$ must meet the function selection criteria listed above, as must the signal pairing of $\phi_{1Q}$ and $\phi_{2Q}$. The mixers 92, 94, 96, 98 are standard mixers as known in the art.

As shown in FIG. 5, mixer M1I 192 receives the input signal x(t) and mixes it with $\phi_{1I}$; subsequent to this, mixer M2I 94 mixes signal x(t) $\phi_{1I}$ with $\phi_{2I}$ to yield the in-phase component of the input signal, that is, x(t) $\phi_{1I}\phi_{2I}$. A corresponding process occurs on the quadrature side of the demodulator, where mixer M1Q 96 receives the input signal x(t) and mixes it with $\phi_{1Q}$; after which mixer M2Q 98 mixes signal x(t) $\phi_{1Q}$ with $\phi_{2Q}$ to yield the quadrature phase component of the input signal, that is, x(t) $\phi_{1Q} \phi_{2Q}$. Several of the synthesizer 76, 78 designs presented herein produce in-phase components only, but it would be clear to one skilled in the art how to generate complementary quadrature mixing signal pairs. Generally, separate in-phase and quadrature channels have not been identified in the interests of simplicity.

Preferred Criteria for $\phi_1$ and $\phi_2$

The general criteria for $\phi_1$ and $\phi_2$ presented above are suitable for most applications. It follows logically, that the further the $\phi_1$ and $\phi_2$ signals are away from the centre frequency, $f_{RF}$, of the input signal x(t), and from the output signal y(t), the less noise will result.

The preferred criteria for selecting the functions $\phi_1$ and $\phi_2$ when demodulating a signal to baseband, are as follows:

$$\lim_{T\to\infty} \frac{1}{T}\int_0^T \varphi_1(t)e^{j2\pi\Delta ft}\,dt = 0 \quad \text{1.}$$

and $$\lim_{T\to\infty} \frac{1}{T}\int_0^T \varphi_2(t)e^{j2\pi(f_{RF}+\Delta f)t}\,dt = 0$$

where $\Delta f$ is less than the bandwidth (BW) of the RF signal/channels being demodulated. This means that $\phi_1$ should not have significant power near DC, and that $\phi_2$ should not have significant power around the frequency of the input signal, $f_{RF}$.

These $\phi_1$ and $\phi_2$ signals are complementary in that $\phi_1$ will suppress DC power output from the $\phi_2$ mixer, and $\phi_2$ will suppress RF power in the signal output from the $\phi_1$ mixer. If the $\phi_1$ signal leaks back through the input, this signal will also be suppressed by $\phi_2$;

or $$\lim_{T\to\infty} \frac{1}{T}\int_0^T \varphi_2(t)e^{j2\pi\Delta ft}\,dt = 0 \quad \text{2.}$$

and $$\lim_{T\to\infty} \frac{1}{T}\int_0^T \varphi_1(t)e^{j2\pi(f_{RF}+\Delta f)t}\,dt = 0$$

where $\Delta f$ is less than the BW of the RF signal/channels of interest. This means that $\phi_2$ should not have significant power around DC, and that $\phi_1$ should not have significant power around $f_{RF}$;

or $$\left|\lim_{T\to\infty} \frac{1}{T}\int_0^T \varphi_1(t)e^{j2\pi\Delta ft}\,dt\right| < \left|\lim_{T\to\infty} \frac{1}{T}\int_0^T \varphi_1(t)e^{j2\pi\Delta Ft}\,dt\right| \quad \text{3.}$$

where $\Delta f<BW$ and $\Delta F>BW$. This means the power of $\phi_1$ within the frequency range of DC, to DC plus the bandwidth (BW) of the input signal, is less than the power of $\phi_1$ at frequencies greater than DC plus the bandwidth of the input signal; and $$\left|\lim_{T\to\infty} \frac{1}{T}\int_0^T \varphi_2(t)e^{j2\pi(f_{RF}+\Delta f)t}\,dt\right| < \left|\lim_{T\to\infty} \frac{1}{T}\int_0^T \varphi_2(t)e^{j2\pi(f_{RF}+\Delta F)t}\,dt\right|$$

where $\Delta f<BW$ and $\Delta F>BW$. This means the power of $\phi_2$ at RF around the BW of the signal should be smaller than the power of $\phi_2$ greater than the BW. Similar to the first condition, the power of $\phi_2$ within the frequency range of $f_{RF}-BW/2$ and $f_{RF}+BW/2$ should be less than the power of $\phi_2$ at frequencies greater than $f_{RF}+BW$.

Considering both conditions, $\phi_1$ and $\phi_2$ should not have a significant amount of power within the bandwidth of the RF signal at baseband. This ensures that if $\phi_1$ leaks into the input port, it does not produce a signal within the baseband signal at the output;

or $$\left|\lim_{T\to\infty} \frac{1}{T}\int_0^T \varphi_2(t)e^{j2\pi\Delta ft}\,dt\right| < \left|\lim_{T\to\infty} \frac{1}{T}\int_0^T \varphi_2(t)e^{j2\pi\Delta Ft}\,dt\right| \quad \text{4.}$$

where $\Delta f<BW$ and $\Delta F>BW$. The power of $\phi_2$ within the frequent range of DC to DC+BW, should be less than the power of $\phi_2$ at frequencies greater than DC+BW; and $$\left|\lim_{T\to\infty} \frac{1}{T}\int_0^T \varphi_1(t)e^{j2\pi(f_{RF}+\Delta f)t}\,dt\right| < \left|\lim_{T\to\infty} \frac{1}{T}\int_0^T \varphi_1(t)e^{j2\pi(f_{RF}+\Delta F)t}\,dt\right|$$

where $\Delta f<BW$ and $\Delta F>BW$. This means the power of $\phi_1$ at RF around the BW of the input signal x(t) should be smaller than the power of $\phi_1$ greater than the BW. That is, the power of $\phi_1$ within the frequency range of $f_{RF}-BW/2$ and $f_{RF}+BW/2$ should be less than the power of $\phi_1$ at frequencies greater than $f_{RF}+BW$.

Use of PN Signals

One way of generating mixing signals $\phi_1$ and $\phi_2$ is to use shift register circuits with feedback similar to those used in the generation of PN (pseudo-random noise) sequences for use in spread-spectrum communications. PN sequences (also referred to as spreading codes, pseudo-random or pseudo-noise) are called "pseudo" because they are not real Gaussian noise; while they appear to be random sequences of binary 1s and 0s, or ±1s, but in fact are perfectly deterministic and periodic. While PN codes have properties which can be exploited by embodiment of the invention, they were clearly developed for an entirely different purpose.

The essence of a spread spectrum communications system is the process of expanding the signal bandwidth in accordance with a spreading code, transmitting that expanded signal, and then recovering the desired signal by reconstructing the received spread-spectrum signal into the original information bandwidth by application of a corresponding de-spreading code. The purpose of this bandwidth trade-off is to allow the system to deliver error-free information in a hostile signal environment.

Two of the properties of PN sequences that make them effective in spread spectrum communications are their auto-correlation and cross-correlation properties. These auto-correlation and cross-correlation properties also make PN sequences well suited for use in the mixer of the invention.

Auto-correlation is the degree of correspondence between a sequence and a phase shifted replica of itself. In a spread-spectrum application, this helps avoid false synchronization. When applied to the invention, this property results in a broad distribution of power across the frequency spectrum.

Cross-correlation is the measure of similarity between two different PN codes. In a spread-spectrum application, this helps signals from being confused with one another. In the context of the invention, signals with good cross-correlation will have very different power spectra. Thus, they will not emphasize images and intermodulation products generated by one another, and in fact, will suppress them.

Pseudo-random noise (PN) codes are generally designed to optimise auto-correlation and cross-correlation in view of the number of codes desired in an application.

Walsh-Hadamard functions are a well known example of PN codes. Walsh-Hadamard functions are generated from rows of special square matrices called Hadamard matrices. Hadamard matrices can be generated recursively as follows:

$$H_{2n} = \begin{bmatrix} H_n & H_n \\ H_n & \overline{H_n} \end{bmatrix}$$

where:

$H_1 = [0]$

Thus:

$$H_2 = \begin{bmatrix} 0 & 0 \\ 0 & 1 \end{bmatrix}$$

$$H_4 = \begin{bmatrix} 0 & 0 & 0 & 0 \\ 0 & 1 & 0 & 1 \\ 0 & 0 & 1 & 1 \\ 0 & 1 & 1 & 0 \end{bmatrix}$$

$$H_8 = \begin{bmatrix} 0 & 0 & 0 & 0 & 0 & 0 & 0 & 0 \\ 0 & 1 & 0 & 1 & 0 & 1 & 0 & 1 \\ 0 & 0 & 1 & 1 & 0 & 0 & 1 & 1 \\ 0 & 1 & 1 & 0 & 0 & 1 & 1 & 0 \\ 0 & 0 & 0 & 0 & 1 & 1 & 1 & 1 \\ 0 & 1 & 0 & 1 & 1 & 0 & 1 & 0 \\ 0 & 0 & 1 & 1 & 1 & 1 & 0 & 0 \\ 0 & 1 & 1 & 0 & 1 & 0 & 0 & 1 \end{bmatrix}$$

Note that rows 5 and 6 of the $H_8$ matrix are the signals presented in FIG. 4(*b*). Other suitable pairings of an $H_8$ Hadamard matrix are rows 3 and 4, and rows 7 and 8.

Note also, that some pairings of Walsh-Hadamard functions have non-zero cross-correlations. That is, some Walsh-Hadamard functions are simply time-shifted versions of others. This causes problems in signal transmission and reception systems, but does not affect their suitability for the invention.

PN sequences can be generated using binary linear feedback shift register (LFSR) and syncopated-register circuits as known in the art. Typically, LFSR circuits are constructed using a series of shift registers, modulo 2 adders (XOR gates) and feedback loops. Syncopated-register circuits are particularly useful because they allow the use of two or more slow generators to produce high rate sequences.

An initial sequence or seed must be loaded into the LFSR, otherwise the shift register series would simply cycle 0s through itself. This seed can be stored in a ROM (read only memory) or processor, or set using DIP (dual in-line package) switches or jumpers. The maximum length of a PN sequence is determined by the length of the register chain and the configuration of the feedback network. An n-bit register can provide up to $2^n$ different combinations of zeros and ones.

PN codes may also be generated using field programmable gate arrays (FPGAs), programmable array logic (PALs), read only memories (ROMs), microcontrollers, digital signal processors (DSPs), microprocessors or other devices known in the art. As well, the PN code generating components could be integrated with the rest of the invention into an ASIC (Application Specific Integrated Circuit).

There are a number of widely used PN sequences known in the art, including Walsh-Hadamard codes, Gold codes and Kasami codes. Gold codes, for example, are generated by adding together the output of two LFSR sequence generators.

Not all PN codes are "balanced", that is, they do not have an equal number of 0s and 1s (or +1s and −1s). All PN codes with an odd number of bits, for example, cannot be balanced. Also, Gold codes do not average to zero.

It is desirable that the mixing signals used in the implementation of the invention be balanced in order to satisfy the conditions outlined hereinabove under the heading "Preferred Criteria for $\phi_1$ and $\phi_2$". If unbalanced PN codes are used to implement the invention, it is preferred that such codes be modified by inserting additional 0s and 1s. The locations of these additional 0s and 1s must be carefully determined to maintain the requirement of $\phi_1(t)*\phi_2(t)$ having a frequency component at the RF carrier frequency.

Figure 6:
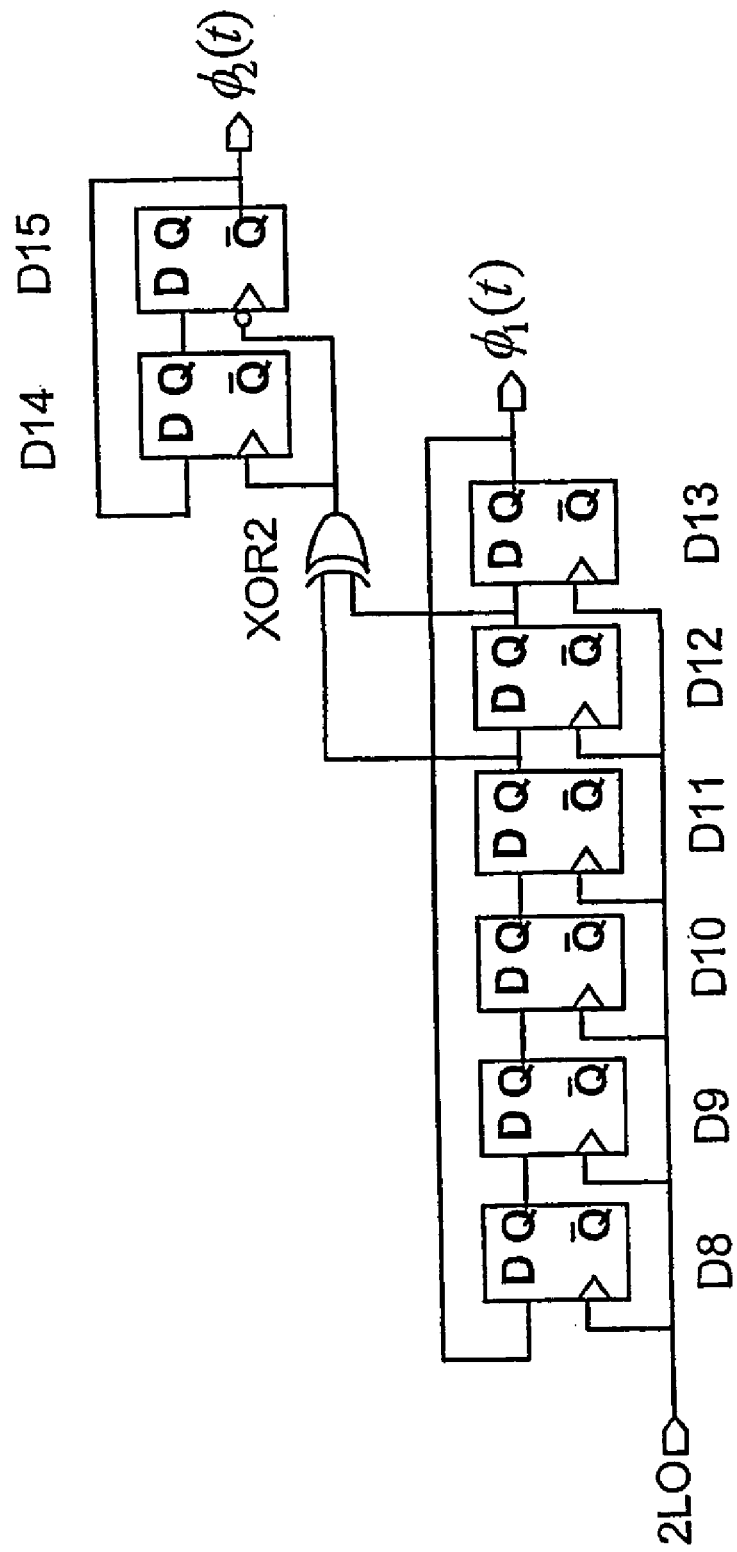
FIG. 6 presents a logic diagram of an exemplary signal synthesizer in an embodiment of the invention, employing a shift register.
Figure 7:
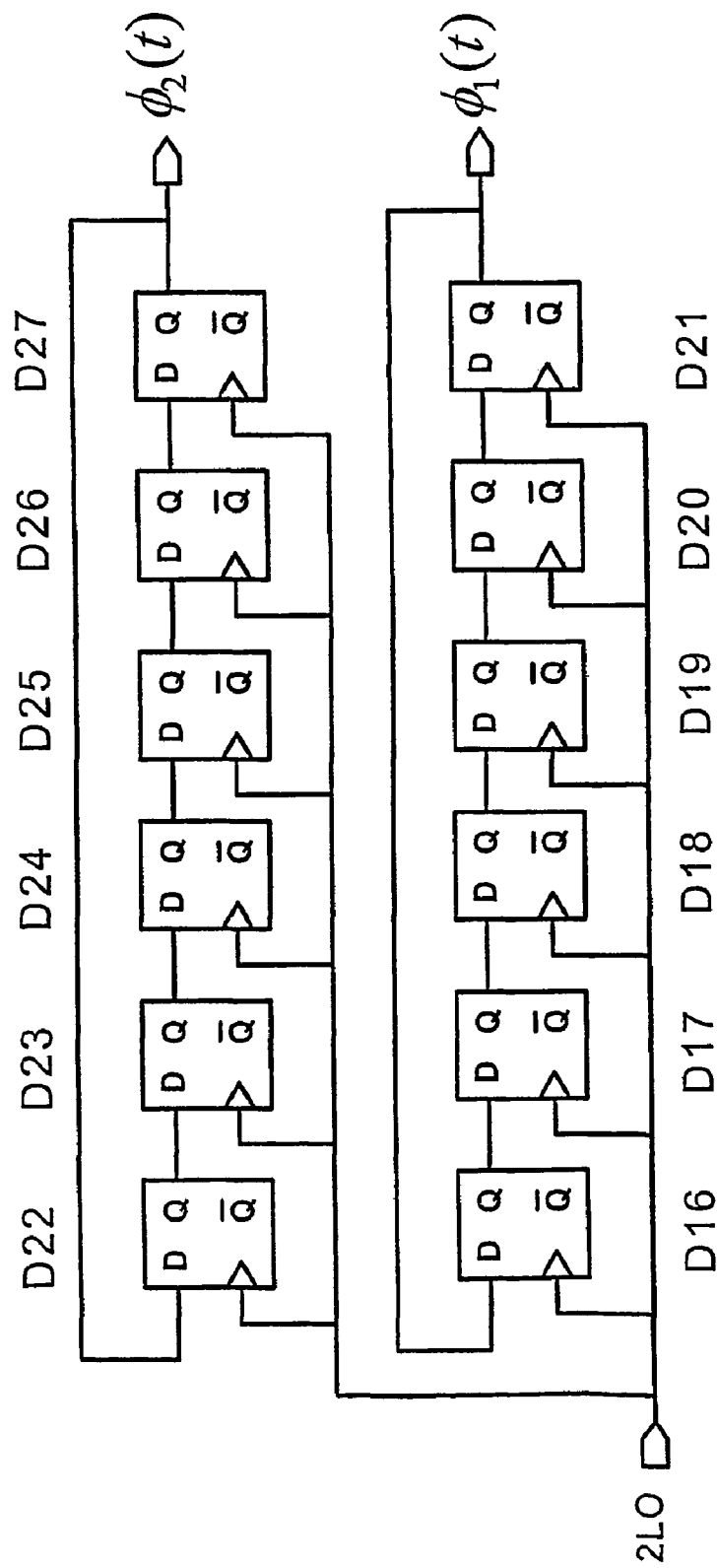
FIG. 7 presents a logic diagram of an exemplary signal synthesizer in an embodiment of the invention, employing two shift registers.
Figure 8:
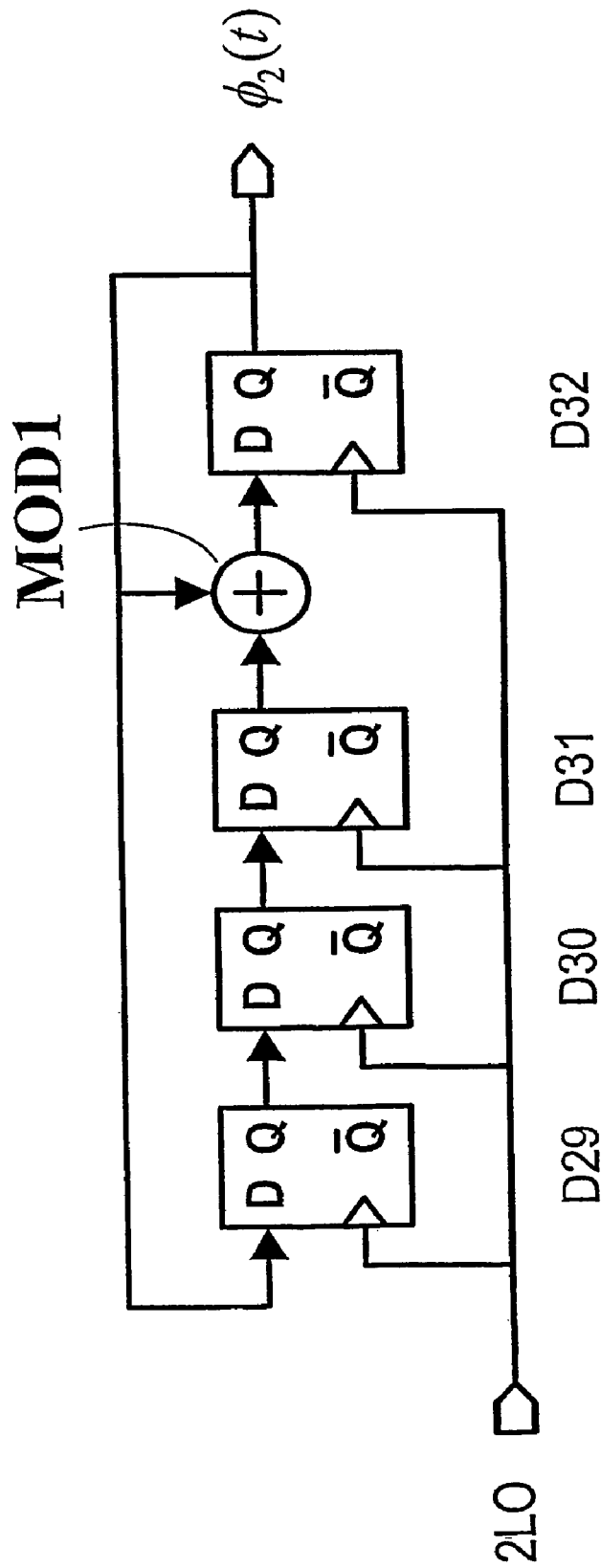
FIG. 8 presents a logic diagram of an exemplary signal synthesizer in an embodiment of the invention, employing a shift register with feedback.

Several methods of generating such VLO signals are presented in FIGS. 6 through 8. Since the LO-leakage problem can occur when power is generated at frequencies in the RF band anywhere on chip, it is preferable that the intermediate signals produced during the generation of the signals $\phi_1$ and $\phi_2$ also avoid the carrier frequency $f_{RF}$ of the input signal x(t). That is, it is preferable not to use an oscillator at the LO frequency, to generate the VLO signals. However, since the leakage path to these intermediate signals often provide some isolation, in such a case the condition on the intermediate signals can be somewhat relaxed.

The synthesizer 100 presented in FIG. 6 uses an input square wave (2LO) at twice the frequency of the RF carrier of the signal being modified to produce the signals $\phi_1(t)$ and $\phi_2(t)$. Here, the D-latches D8 through D13 form a shift register which is clocked by the signal 2LO. Since this circuit uses an oscillator at twice the carrier frequency of the input signal, there is no LO signal to leak to the output or into other parts of the circuit. Similarly, none of the intermediate signals, nor either of the mixer signals $\phi_1(t)$ and $\phi_2(t)$, has an LO frequency component. The shift register can be initially loaded with a predetermined sequence and the output $\phi_1$ will cycle through that sequence producing the desired output. The second output $\phi_2$ is then produced by taking the output of consecutive taps from the shift register, and exclusive-ORing them together with gate XOR2 to produce a signal that can be used to clock a second shift register (D14 and D15). The output of the second shift register is then $\phi_2$.

Because there is no feedback in the D-latch sequence D8 through D13, this circuit will repeatedly output a signal that consists of six-bits at the 2LO frequency. Typical LFSR circuits have feedback loops that generate far longer bit strings before they repeat.

FIG. 7 shows a method similar to that of FIG. 6, except that signal $\phi_2$ is generated by a second shift register (D22 through D27), which is a duplicate of the shift register that produces the signal $\phi_1$ (D16 through D21). As well, there is a difference in the initial loading of the shift registers; the first shift register being loaded with the sequence that will produce $\phi_1$, and the second being loaded with the sequence which will produce $\phi_2$.

An example of a shift register circuit which generates a longer bit string before repeating, is presented in the block diagram of FIG. 8. In this figure, the D-latches D29 through D32 form a shift register which is clocked by the signal at twice the RF carrier frequency. MOD1 does a modulo-2 multiplication of the output of D31 with the output of D32, which is then fed into the input of D32 to produce the required feedback. The signal $\phi_2$ is then produced at the output of D32. A similar shift register with similar feedback can be used to produce the signal $\phi_1$.

The signals of the invention may also be generated in many other ways, which would be clear from the teachings herein.

Minimizing Aliasing Power

Depending on the process conditions and signals involved, aliasing of unwanted signals into the desired signal's spectrum can occur for the architecture shown in FIG. 3.

Unwanted signals may arrive at the receiver or transmitter via many different paths. As these unwanted signals are mixed with the VLO signals, aliasing of out of band power into the signal spectrum may occur. The complementary mixing along the mixing path will remove much of this unwanted signal power from the bandwidth of the desired signal, but a portion of the aliased power may remain within the bandwidth of the output desired signal.

This aliasing power can be reduced in several manners, including the following:
1. by pre-filtering the signal being modulated or demodulated, to remove out-of-band signals. The τ/T ratio of the pre-filter should be as small as possible to minimize the aliased power into the baseband region; or
2. by aligning edges of the incoming and modulating/demodulating signals. This can be effected by coordination of the switching devices in the circuit (as the switching speed of the devices is usually the limiting factor), or alternatively, by use of edge placement techniques. Edge alignment can easily be effected in digital logic, using techniques known in the art. For example, a signal can be fed into a delay (D-type) flip-flop, which is clocked at a constant rate. The output of the D flip-flop will be the same as the input signal, except that the leading edge of the output will be aligned with that of the clock signal.

DC Offset Correction

As noted above, a problem with direct conversion techniques is that DC noise signals will be generated by the direct conversion process, and interfere with low-frequency information contained in the demodulated baseband signal. These DC noise signals are particularly difficult to overcome because they are typically unpredictable and time varying. Exemplary mechanisms which may generate such DC signals include the following:
1. local oscillator leakage. Local oscillator power leaking to the RF input will result in DC levels at mixer outputs because these signals will be mixed with themselves. Because one of the output signals from a mixer is the difference between the frequencies being mixed, this "self-mixing" results in a DC signal at the mixer output;
2. intermodulation products. Mixing generates sum and difference products from primary signals. Intermodulation products are distortions of those products, which may be generated by non-linearities in electronic components, or harmonics in the signals being mixed; and
3. leakage of channel interferers. DC levels may be created at the mixer output when large nearby channel interferers leak into the local oscillator port of the front-end mixer and are self-mixed down to DC.

Hence, there is a potential for large, time-varying DC signals to interfere with the comparatively low-amplitude signals of at interest at or near DC, at the output of the modulator or demodulator.

Depending on the extent to which the restrictions on the mixing signals of the invention are applied, and other process conditions, DC offset may or may not be a significant problem. The level of these DC signals may be reduced or compensated for in a number of manners:

1. Capacitive Coupling

Placing a capacitor in series with the signal path will block DC noise signals but will also block components of the desired signal near zero frequency. The severity of the data loss is dependent upon the transmission modulation and signal coding. Some modulation techniques such as FSK (frequency shift keying), place no information bearing signal energy at or near DC. Capacitive coupling also has the disadvantage that the size of the capacitors are generally too large for a fully integrated receiver.

2. Adaptive Feedback

DC noise signals may also be removed by the use of adaptive feedback that time-averages the suspected DC offset value and subtracts the corresponding amount from a convenient point along the receive path. While feedback-based DC-offset reduction techniques are more effective than capacitive coupling and are more easily applied to integrated solutions, the following must be considered when they are applied:
   a. the increased level of complexity they add to the design;
   b. since the DC offsets and near DC offsets may be indistinguishable from the desired data, some amount of training time is normally required on a periodic basis to determine the DC offset accurately; and
   c. if a long-term average of the DC offset is used to estimate how much offset must be subtracted from the input, then this technique will not respond well to rapid variations in the DC offset level.

Multi-stage Mixing

In FIG. 3, two mixer signals are used to perform the down-conversion or up-conversion of x(t). It is also possible to use more than two signals to accomplish the same goal. The block diagram of FIG. 9 presents such a variation, where several functions $\phi_1, \phi_2, \phi_3 \ldots \phi_n$ are used to generate the virtual LO. Here, $\phi_1^* \phi_2^*$ has a significant power level at the LO frequency being emulated, and the grouping of the functions $\phi_1 \ldots \phi_n$ are complementary in that they suppress power from one another, within the bandwidth of the input signal x(t), and within the bandwidth of the output signal.

Each of the methods of signal generation described herein, can easily be extended to produce such groups of complementary mixing signals.

General Case

Figure 10:
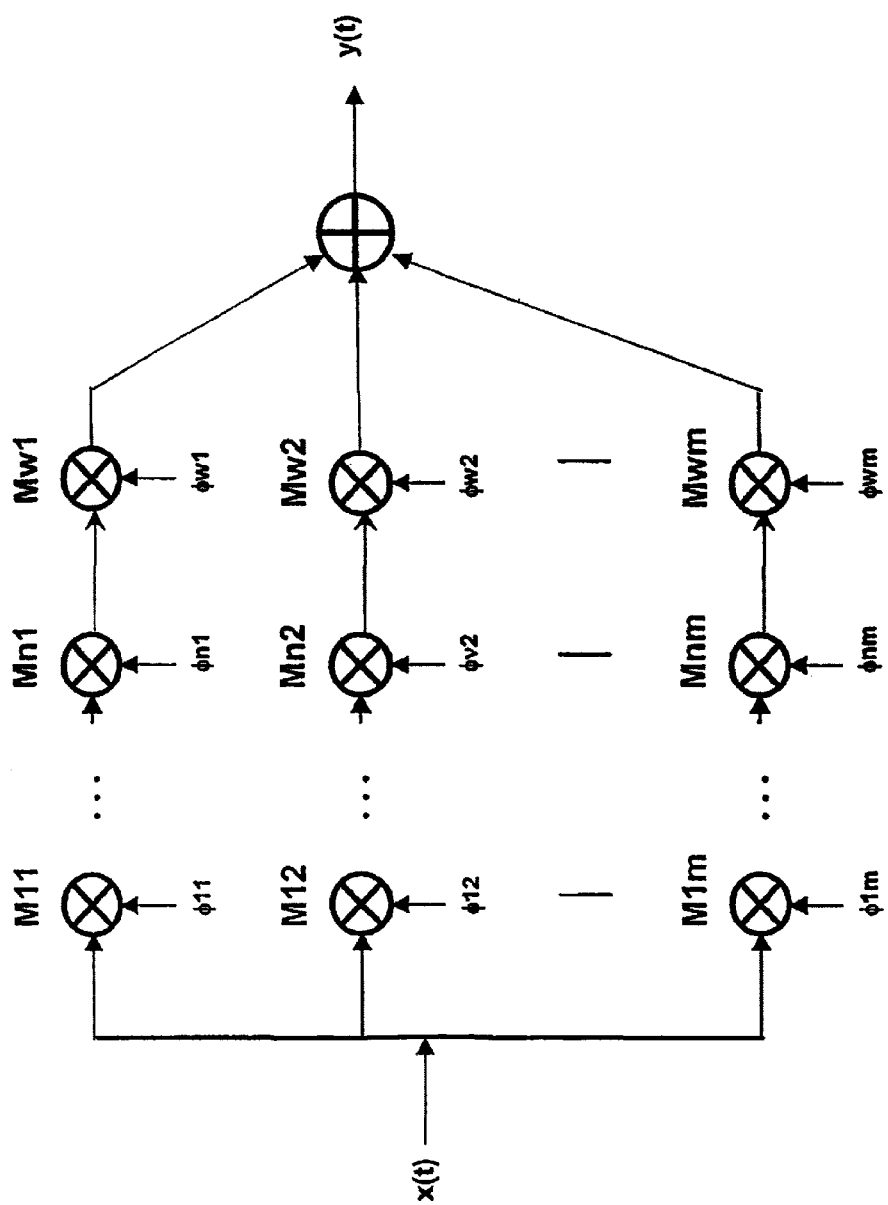
FIG. 10 presents a block diagram of an embodiment of the invention employing M weighted mixer systems.

The general implementation of the invention is presented in the block diagram of FIG. 10. In this form, the invention consists of m parallel signal paths in which each signal path can be modelled as n mixers operating in series. The outputs of the m signal paths are combined into a single output signal y(t) via mixers $M_{w1}$ through $M_{wm}$, and the summer. Each mixer path is modulated by a weighting factor, $\phi_{w1}$ through $\phi_{wm}$.

The weighting factors could be binary, in that one or more particular signal paths are chosen at a time, or may modulate the amplitude of the various signal paths before mixing. For example, each mixer path could be supplied with a different set of mixer signals $\phi_{1x}$ through $\phi_{nx}$, and mixer paths be chosen which optimise certain desired parameters (for example, maximizing amplitude of the output signal, minimizing interference, etc.). As well, these weighing factors may vary with time.

Multiple outputs could also be provided by tapping each mixer path between mixer $M_{nx}$ and $M_{wx}$, and mixing these signals using another set of weighting factors and mixers, and another summer.

The invention allows one to fully integrate a RF transmitter on a single chip without using external filters. Furthermore, the RF transmitter can be used as a multi-standard transmitter because new mixing sequences can easily be generated. This is in contrast to existing mixer systems which are typically hard wired.

It would be clear to one skilled in the art that many variations may be made to the designs presented herein, without departing from the spirit of the invention. One such variation to the basic structure in FIG. 3 is to add a filter between the two mixers 72 and 74 to remove unwanted signals that are transferred to the output port. This filter may be a low pass, high pass, or band pass filter depending on the transmitter requirements, and may be purely passive, or have active components.

The electrical circuits of the invention may be described by computer software code in a simulation language, or hardware development language used to fabricate integrated circuits. This computer software code may be stored in a variety of formats on various electronic memory media including computer diskettes, CD-ROM, Random Access Memory (RAM) and Read Only Memory (ROM). As well, electronic signals representing such computer software code may also be transmitted via a communication network.

Clearly, such computer software code may also be integrated with the code of other programs, implemented as a core or subroutine by external program calls, or by other techniques known in the art.

The construction of the necessary logic to generate the mixing signals of the invention would be clear to one skilled in the art from the description herein. Such signals may be generated using conventional methods and components including basic logic gates, field programmable gate arrays (FPGAs), programmable array logic (PALs) or gate array logic (GALs). The signals of the invention may also be stored on memory devices such as read only memories (ROMs), programmable read only memories (PROMs), erasable programmable read only memories (EPROMs), electrically erasable programmable read only memories (EEPROMs) or flash memory, and cycled out as required. The embodiments of the invention may also be implemented using processor-type devices such as digital signal processors (DSPs), microcontrollers, microprocessors, or similar devices as known in the art Such implementations would be clear to one skilled in the art.

The invention may be applied to various communication protocols and formats including: amplitude modulation (AM), frequency modulation (FM), frequency shift keying (FSK), phase shift keying (PSK), cellular telephone systems including analogue and digital systems such as code division multiple access (CDMA), time division multiple access (TDMA) and frequency division multiple access (FDMA).

The invention may be applied to such applications as wired communication systems include computer communication systems such as local area networks (LANs), point to point signalling, and wide area networks (WANs) such as the Internet, using electrical or optical fibre cable systems. As well, wireless communication systems may include those for public broadcasting such as AM and FM radio, and UHF and VHF television; or those for private communication such as cellular telephones, personal paging devices, wireless local loops, monitoring of homes by utility companies, cordless telephones including the digital cordless European telecommunication (DECT) standard, mobile radio systems, GSM and AMPS cellular telephones, microwave backbone networks, interconnected appliances under the Bluetooth standard, and satellite communications.

While particular embodiments of the present invention have been shown and described, It is clear that changes and modifications may be made to such embodiments without departing from the true scope and spirit of the invention.

What is claimed is:

1. A synthesizer for generating signals to be input to successive mixers for modulating or demodulating an input signal x(t) to an output y(t), said synthesizer comprising:
    a first signal generator for producing a first time-varying signal $\phi_1$; and
    a second signal generator for producing a second time-varying signal $\phi_2$;
    where $\phi_1 * \phi_2$ has significant power at the frequency of a local oscillator signal being emulated, and one of said $\phi_1$ and $\phi_2$ has minimal power around the frequency of said output y(t), while the other of said $\phi_1$ and $\phi_2$ has minimal power around the centre frequency, $f_{RF}$, of said input signal x(t).

2. The synthesizer of claim 1, wherein the power of $\phi_1$ around the frequency of said output y(t) is minimized, and the power of $\phi_2$ around the centre frequency, $f_{RF}$, of said input signal x(t) is minimized.

3. The synthesizer of claim 1, wherein the power of $\phi_2$ around the frequency of said output y(t) is minimized, and the power of $\phi_1$ around the centre frequency, $f_{RF}$, of said input signal x(t) is minimized.

4. The synthesizer of claim 1, for demodulating of said input signal x(t) to baseband, wherein the power of $\phi_1$ near DC is minimized, and the power of $\phi_2$ around the centre frequency, $f_{RF}$, of said input signal x(t) is minimized.

5. The synthesizer of claim 1, for demodulating of said input signal x(t) to baseband, wherein the power of $\phi_2$ near DC is minimized, and the power of $\phi_1$ around the centre frequency, $f_{RF}$, of said input signal x(t) is minimized.

6. The synthesizer of claim 1, wherein:
    the power of $\phi_1$ within the frequency range of DC to DC plus the bandwidth, BW, of said input signal x(t), is less than the power of $\phi_1$ at frequencies greater tran DC plus BW; and
    the power of $\phi_2$ within the frequency range of $f_{RF}$–BW/2 and $f_{RF}$+BW/2 is less than the power of $\phi_2$ at frequencies greater than $f_{RF}$+BW.

7. The synthesizer of claim 1, wherein:
    the power of $\phi_2$ within the frequency range of DC to DC plus the bandwidth, BW, of said input signal x(t), is less than the power of $\phi_2$ at frequencies greater than DC plus BW; and
    the power of $\phi$ within the frequency range of $f_{RF}$–BW/2 and $f_{RF}$+BW/2 is less than the power of $\phi_1$ at frequencies greater than $f_{RF}$+BW.

8. The synthesizer of claim 1, wherein:

$$\lim_{T \to \infty} \frac{1}{T} \int_0^T \varphi_1(t) e^{j2\pi \Delta f t} \, dt = 0$$

and

-continued $$\lim_{T\to\infty} \frac{1}{T} \int_0^T \varphi_2(t) e^{j2\pi(f_{RF}+\Delta f)t} \, dt = 0$$

where Δf is less than BW.

9. The synthesizer of claim 1, wherein:

$$\lim_{T\to\infty} \frac{1}{T} \int_0^T \varphi_2(t) e^{j2\pi\Delta ft} \, dt = 0$$

and $$\lim_{T\to\infty} \frac{1}{T} \int_0^T \varphi_1(t) e^{j2\pi(f_{RF}+\Delta f)t} \, dt = 0$$

where Δf is less than BW.

10. The synthesizer of claim 1, wherein:

$$\left| \lim_{T\to\infty} \frac{1}{T} \int_0^T \varphi_1(t) e^{j2\pi\Delta ft} \, dt \right| < \left| \lim_{T\to\infty} \frac{1}{T} \int_0^T \varphi_1(t) e^{j2\pi\Delta Ft} \, dt \right|$$

where Δf<BW and ΔF>BW; and $$\left| \lim_{T\to\infty} \frac{1}{T} \int_0^T \varphi_2(t) e^{j2\pi(f_{RF}+\Delta f)t} \, dt \right| < \left| \lim_{T\to\infty} \frac{1}{T} \int_0^T \varphi_2(t) e^{j2\pi(f_{RF}+\Delta F)t} \, dt \right|$$

where Δf<BW and ΔF>BW.

11. The synthesizer of claim 1, wherein:

$$\left| \lim_{T\to\infty} \frac{1}{T} \int_0^T \varphi_2(t) e^{j2\pi\Delta ft} \, dt \right| < \left| \lim_{T\to\infty} \frac{1}{T} \int_0^T \varphi_2(t) e^{j2\pi\Delta Ft} \, dt \right|$$

where Δf<BW and ΔF>BW; and $$\left| \lim_{T\to\infty} \frac{1}{T} \int_0^T \varphi_1(t) e^{j2\pi(f_{RF}+\Delta f)t} \, dt \right| < \left| \lim_{T\to\infty} \frac{1}{T} \int_0^T \varphi_1(t) e^{j2\pi(f_{RF}+\Delta F)t} \, dt \right|$$

where Δf<BW and ΔF>BW.

12. The synthesizer of claim 4, wherein said first and second time-varying signals are irregular.

13. The synthesizer of claim 4, wherein said first and second time-varying signals are digital waveforms.

14. The synthesizer of claim 4, wherein said first and second time-varying signals are square waveforms.

15. The synthesizer of claim 4, wherein said first and second time-varying signals are randomly generated.

16. The synthesizer of claim 4, wherein said first and second time-varying signals are pseudo-randomly generated.

17. The synthesizer of claim 4, wherein said first and second time-varying signals are periodic functions of time.

18. The synthesizer of claim 4, wherein said first and second time-varying signals are pseudo noise (PN) signals.

19. The synthesizer of claim 4, wherein said first and second time-varying signals $\phi_1$ and $\phi_2$ are pseudo noise (PN) signals with additional values inserted to balance the voltage of said pseudo noise signals over time.

20. The synthesizer of claim 4, wherein said first and second time-varying signals are generated using linear feedback shift register (LFSR) circuits.

21. The synthesizer of claim 4, wherein said first and second signal generators comprise:
 shift register means for generating said first and second time-varying signals $\phi_1$ and $\phi_2$ by shifting out corresponding predetermined sequences.

22. The synthesizer of claim 21, wherein said shift register means comprises:
 a shift register for receiving an oscillator signal at twice the frequency of the local oscillator signal being emulated, and generating said first time-varying signal $\phi_1$, by shifting out a predetermined sequence.

23. The synthesizer of claim 22, wherein said second signal generator comprises:
 an exclusive-OR (XOR) circuit for comparing outputs of consecutive latches in said shift register; and,
 a second shift register being clocked by said XOR output, and generating said second time-varying signal $\phi_2$, by shifting out a second predetermined sequence.

24. The synthesizer of claim 22, wherein said second signal generator comprises:
 a third shift register for receiving said oscillator signal at twice the frequency of the local oscillator signal being emulated, and generating said second time-varying signal $\phi_2$, by shifting out a predetermined sequence.

25. The synthesizer of claim 4, wherein said first signal generator comprises:
 a shift register with a feedback loop.

26. The synthesizer of claim 21, wherein said first signal generator comprises:
 a shift register for receiving an oscillator signal at twice the frequency of the local oscillator signal being emulated, and generating said first time-varying signal $\phi_1$, by shifting out a predetermined sequence; and
 a modulo-2 multiplier for receiving said first time-varying signal $\phi_1$ and the output of an earlier latch in said shift register, feeding an output into a later latch in said shift register.

27. The synthesizer of claim 4 comprising:
 one or more additional signal generators for producing one or more additional time-varying signals;
 where the product of all of said time-varying signals has significant power at the frequency of a local oscillator signal being emulated, and none of said all of said time-varying signals has significant power at the frequency of said local oscillator signal being emulated.

28. A modulator or demodulator comprising:
 multiple mixing streams;
 each said mixing stream having:
  two mixers;
  a first signal generator for producing a first time-varying signal $\phi_1$; and
  a second signal generator for producing a second time-varying signal $\phi_2$;
 where $\phi_1 * \phi_2$ has significant power at the frequency of a local oscillator signal being emulated, and one of said $\phi_1$ and $\phi_2$ has minimal power around the frequency of said output y(t), while the other of said $\phi_1$ and $\phi_2$ has minimal power around the centre frequency, $f_{RF}$, of said input signal x(t); and
 a weighted summer for receiving the output of each said mixing stream and combining a weighted factor of each of said outputs.

29. The modulator or demodulator of claim 28, wherein said weighted factor of each of said outputs vary with time.

30. The synthesizer of claim 4 comprising:
pre-filtering means to reduce aliasing power.

31. The synthesizer of claim 30 comprising: minimizing τ/T of said pre-filtering means to reduce aliasing power.

32. The synthesizer of claim 4 comprising:
edge placement means to reduce aliasing power.

33. The synthesizer of claim 4 comprising:
direct current (DC) offset correction means.

34. The synthesizer of claim 33 wherein said DC offset correction means comprises coupling capacitors.

35. The synthesizer of claim 33 wherein said DC offset correction means comprises adaptive feedback means.

36. The synthesizer of claim 35 wherein said adaptive feedback means comprises time averaging of said input signal.

37. The synthesizer of claim 35 wherein said adaptive feedback means comprises a predetermined training time.

38. The synthesizer of claim 35 wherein said adaptive feedback means comprises long-term averaging.

39. An integrated circuit comprising the device of any one of claims 1 to 38.

40. A computer readable memory medium, storing computer software code in a hardware development language for fabrication of an integrated circuit comprising the device of any one of claims 1 to 38.

41. A computer data signal embodied in a output wave, said computer data signal comprising computer software code in a hardware development language for fabrication of an integrated circuit comprising the device of any one of claims 1 to 38.

42. A method of modulating or demodulating an input signal x(t) to an output y(t), comprising the steps of:
generating a first time-varying signal $\phi_1$;
generating a second time-varying signal $\phi_2$;
where $\phi_1 * \phi_2$ has significant power at the frequency of a local oscillator signal being emulated, and one of said $\phi_1$ and $\phi_2$ has minimal power around the frequency of said output y(t), while the other of said $\phi_1$ and $\phi_2$ has minimal power around the centre frequency, $f_{RF}$, of said input signal x(t);
mixing said input signal x(t) with said first time-varying signal $\phi_1$ to generate a x(t)*$\phi_1$ signal; and
mixing said x(t)*$\phi_1$ signal with said second time-varying signal $\phi_2$ to generate said output y(t).

* * * * *

UNITED STATES PATENT AND TRADEMARK OFFICE
CERTIFICATE OF CORRECTION

PATENT NO. : 7,215,931 B2 Page 1 of 1
APPLICATION NO. : 10/363158
DATED : May 8, 2007
INVENTOR(S) : Chris Snyder et al.

It is certified that error appears in the above-identified patent and that said Letters Patent is hereby corrected as shown below:

Front page, item (22), delete "2002" and instert therefor -- 2001 --

Signed and Sealed this

Eighteenth Day of March, 2008

JON W. DUDAS
*Director of the United States Patent and Trademark Office*